United States Patent
Jackson

(10) Patent No.: US 6,534,429 B1
(45) Date of Patent: *Mar. 18, 2003

(54) MULTI-COMPONENT MATERIAL FOR UNCOOLED THERMAL IMAGING AND GRAPHICAL METHOD FOR THE DETERMINATION THEREOF

(75) Inventor: David A. Jackson, Ft. Myers, FL (US)

(73) Assignee: The United States of America as represented by the Secretary of the Army, DC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/528,956

(22) Filed: Mar. 20, 2000

(51) Int. Cl.⁷ .................. C04B 35/474; C04B 35/465; C04B 35/46

(52) U.S. Cl. ............... 501/138; 501/137; 423/598

(58) Field of Search .................. 423/598; 501/138, 501/137

(56) References Cited

U.S. PATENT DOCUMENTS

| | | | | |
|---|---|---|---|---|
| 2,467,169 A | * | 4/1949 | Wainer | 501/137 |
| 5,079,200 A | | 1/1992 | Jackson | 501/136 |

OTHER PUBLICATIONS

Jona and Shirane, Ferroelectric Crystals, International Series of Monographs on Solid State Physics, vol. #1, pp. 241 and 249 (1962).

* cited by examiner

Primary Examiner—C. Melissa Koslow
(74) Attorney, Agent, or Firm—U. John Biffoni; William V. Adams

(57) ABSTRACT

A multi-component material is represented by the general formula (I):

$$Ba_{(1-x-y)}Pb_yM_xTiO_3 \qquad (I)$$

in which:

M is Sr or Cd;

x is the decimal fraction molar concentration of $MTiO_3$, where x has a value equal to or greater than about 0.20 and less than or equal to about 0.75; and y is the decimal fraction molar concentration of $PbTiO_3$, where y has a value greater than zero and less than or equal to about 0.40, and x+y is less than 1.0. In addition, a method of graphically estimating the composition of the multi-component material represented by the general formula (I) is disclosed herein. In a preferred embodiment, x has a value between about 0.28 and 0.66, and y has value greater than zero and less than or equal to about 0.34, while said material has a Curie point temperature of about 25° C. or room temperature. These room temperature Curie point materials are useful in uncooled thermal imaging applications.

6 Claims, 4 Drawing Sheets

MULTI-COMPONENT MATERIAL FOR UNCOOLED THERMAL IMAGING AND GRAPHICAL METHOD FOR THE DETERMINATION THEREOF

The invention described herein may be manufactured, used, and/or licensed by or for the United States Government.

BACKGROUND OF THE INVENTION

1. Field of the Invention

This invention relates generally to a multi-component material having a wide range of compositions which is suitable for use in devices such as uncooled thermal imaging detectors. The invention also relates to a simple graphical means by which to provide a first order estimate of the desired composition of the multi-component material.

2. Discussion of the Prior Art

Thermal detectors and imagers which employ thermally sensitive materials may utilize ferroelectric and pyroelectric compounds such as barium strontium titanate. Each material has its characteristic Curie point, i.e., the transition temperature at which the material changes from being ferroelectric to paraelectric. This change is accompanied by a rapid change in the dielectric constant as the temperature reaches the Curie point. By selecting the proper amounts of related materials, a solid solution of the materials can be fabricated which has a room temperature (i.e., 25° C.) Curie point. With such a material, very small changes in thermal energy can be detected as the material goes through the transition point, as manifested by large changes in either the electronic capacitance or the dielectric constant. These dramatic changes in values constitute an electronic signal. When this material is made into an array of very small detectors, the resulting combined electronic signals from all of the detectors produce an electronic image of the thermal scene.

Multi-component materials such as $BaSrTiO_3$ have heretofore been employed in the imaging arrays of uncooled thermal detectors, which by design, operate at ambient or room temperature. Since $BaSrTiO_3$ is, however, relatively expensive, other multi-component materials may be employed which possess similar characteristics and operate in the same manner.

A detector material consisting of $PbSrTiO_3$ having a composition defined by the general formula $Pb_{(1-x)}Sr_xTiO_3$ is disclosed in U.S. Pat. No. 5,079,200, the disclosure of which is incorporated by reference herein. In one embodiment the material contains approximately 64–68% strontium titanate, which provides a detector material with a Curie point temperature and maximum sensitivity near standard or room temperature.

Thus, in order to reduce the expense associated with devices which employ $BaSrTiO_3$, it is desirable to utilize alternative multi-component compositions which while operating in the same manner as $BaSrTiO_3$, and also offer a broader range of potential compositions.

SUMMARY OF THE INVENTION

It is an object of the present invention to provide a multi-component material having a wide range of compositions which is suitable for use in devices such as uncooled thermal imaging detectors. It is a farther object of the invention to provide a graphical method which facilitates the preparation of a first order estimate of the composition of the multi-component material.

Accordingly, the present invention relates to a multi-component material represented by the general formula (I):

$$Ba_{(1-x-y)}Pb_yM_xTiO_3 \qquad (I)$$

in which:

M is Sr or Cd;

x is the decimal fraction molar concentration of $MTiO_3$, where x has a value equal to or greater than about 0.20 and less than or equal to about 0.75;

y is the decimal fraction molar concentration of $PbTiO_3$, where y has a value greater than zero and less than or equal to about 0.40; and x+y is less than 1.0.

The invention also relates to a graphical method of estimating the composition of the multi-component material represented by the general formula (I) comprising the steps of:

selecting a value of x;

locating a first point on a first graphical representation comprising a temperature axis (y-axis) representing Curie points in °C. and a concentration axis (x-axis) representing mole percentage of $BaTiO_3$ and $MTiO_3$, the first point corresponding to the intersection of an abscissa representing x expressed as a mole percentage, with an ordinate representing a temperature (T) between about −40° C. to 60° C., with 25° C. (room temperature) being preferred;

locating a second point on the first graphical representation corresponding to the intersection of an abscissa representing 100% $MTiO_3$ with an ordinate representing a temperature of −220° C.;

drawing a straight line from the second point through the first point, and extending said line to intercept the temperature axis and line DE at a third point; where line DE now represents the decimal mole fraction of $PbTiO_3$ in the $BaTiO_3/PbTiO_3$ system (See FIG. 1-B);

and multiplying the decimal mole fraction of $PbTiO_3$ identified by the third point by a value equal to 1−x to determine the value of y.

Thus, by selecting a value of x within the allowed range for a desired temperature (preferably ambient or room temperature) operation, and then employing graphical means, the corresponding value of y can be determined, and a first order estimate of the desired composition of a 3-component titanate can be provided.

BRIEF DESCRIPTION OF THE DRAWINGS

Other objects, features, and advantages of the present invention will become more fully apparent from the following detailed description of the preferred embodiments, the appended claims, and the accompanying drawings. As depicted in the attached drawings:

FIG. 1-B incorporates line DE as a 10-unit scale to designate the decimal mole fraction of $PbTiO_3$ in the $BaTiO_3/PbTiO_3$ system.

DESCRIPTION OF THE PREFERRED EMBODIMENTS

The present invention will be disclosed in terms of the currently perceived preferred embodiments thereof.

Figure 1A:
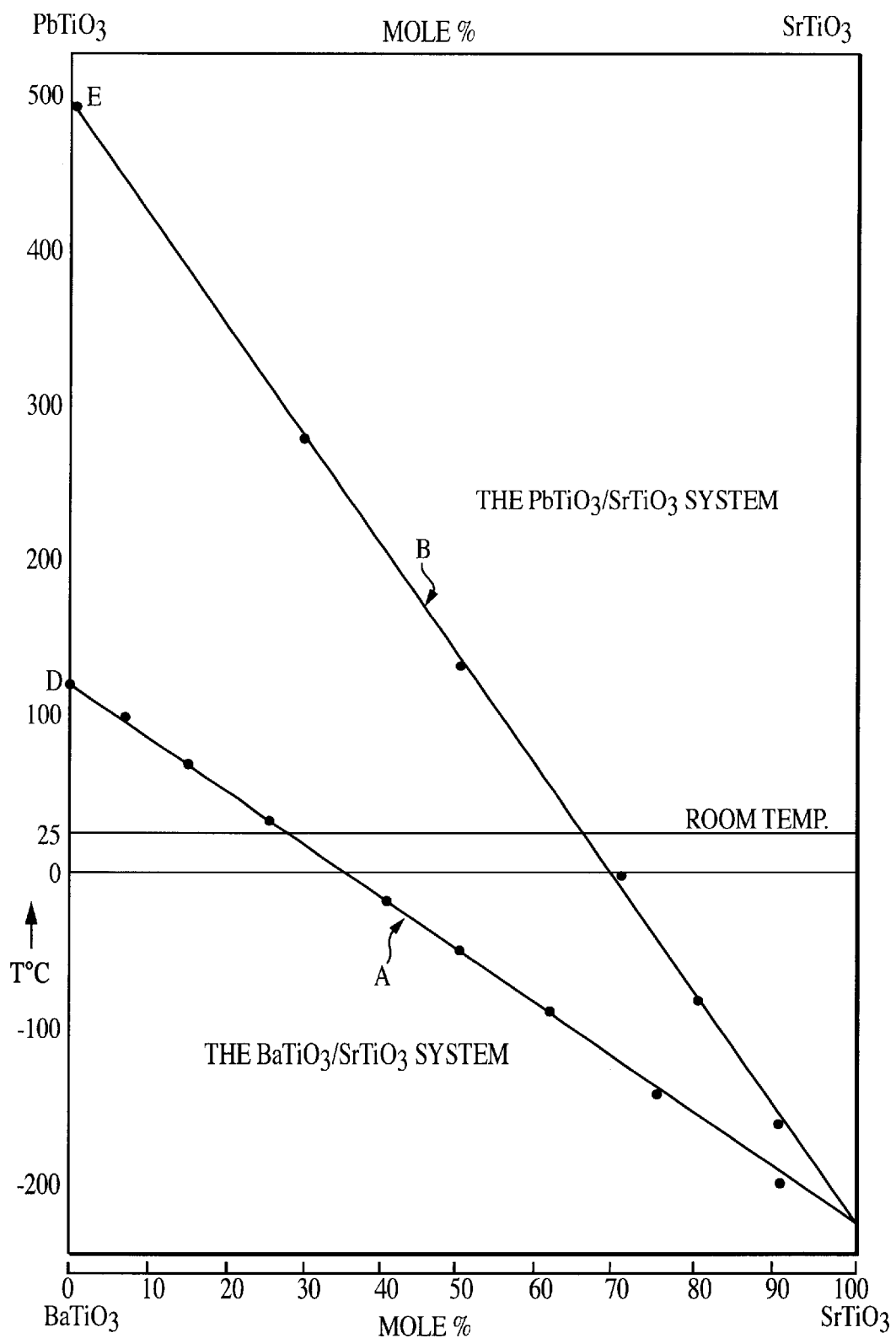
FIG. 1-A is a combined plot of Curie point temperature (°C.) versus concentration (mole %) for the $BaTiO_3/SrTiO_3$ system (curve A), and Curie point temperature (°C.) versus concentration (mole %) for the $PbTiO_3/SrTiO_3$ system (Curve B).
Figure 1B:
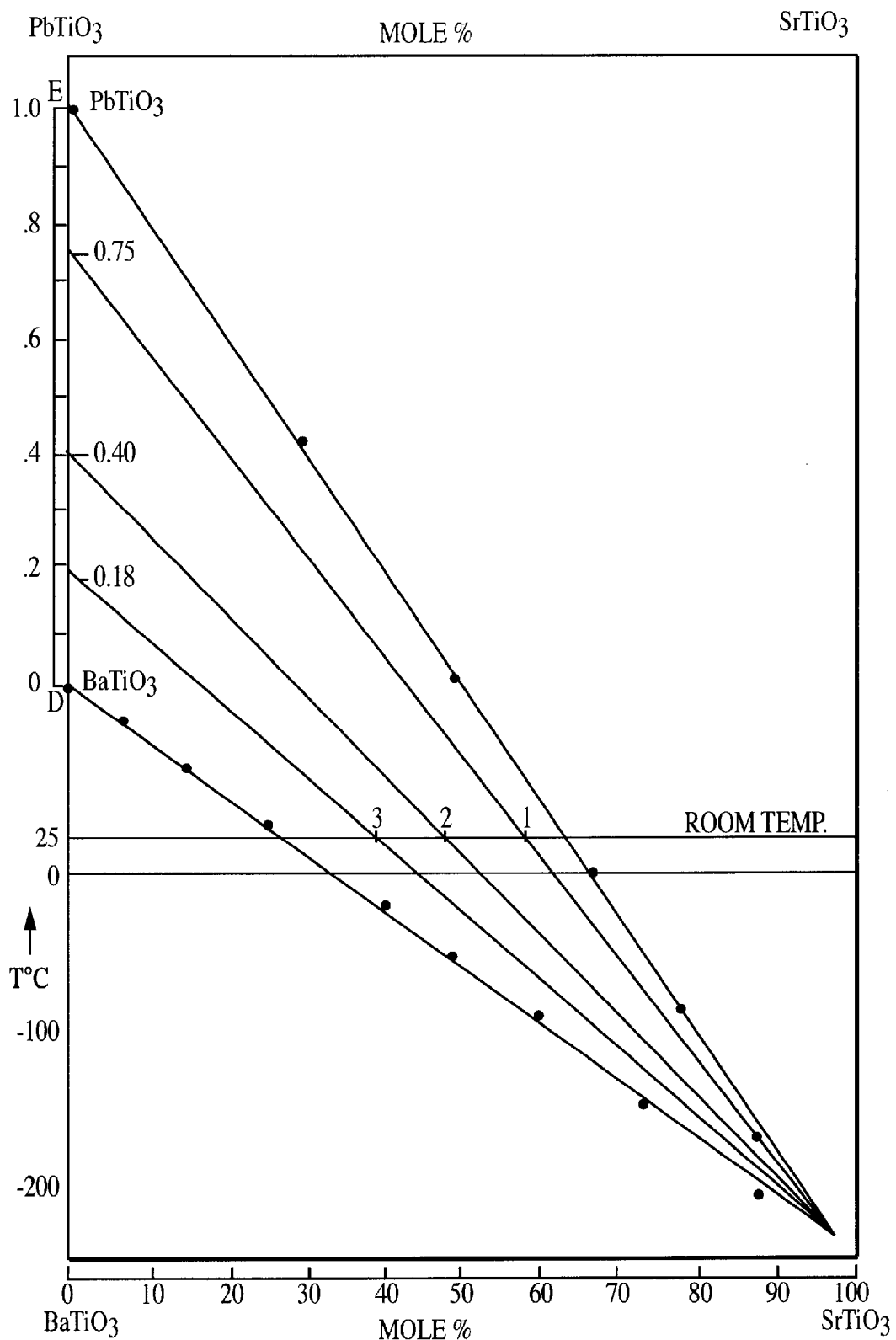

In a first preferred embodiment, the character "M" in the general formula (I) represents strontium, and the Curie point temperature is room temperature, i.e., 25° C. The method of determining the amount of each of the components of the multi-component material is accomplished by utilizing combined graphical representations of each material. FIG. 1-A presents a first graph of a broad range of barium and strontium titanates, see Reference *Ferroelectric Crystals,* by Jona and Shirane, International Series of Monographs on Solid State Physics, Vol. #1, pages 241 and 249 (1962), and a second graph of a broad range of lead and strontium titanates from a paper by Nomura and Sawada, J. Phys. Soc. Of Japan, Vol 10, page 108 (1955) reproduced on page 249 of Jona & Shirane. When Curie points versus molar concentrations (%) are plotted for the $BaTiO_3/SrTiO_3$ system and the $PbTiO_3/SrTiO_3$ system on the same graph, the results appear as depicted in FIG. 1-A as curves A and B.

Curves A and B are essentially linear and a room temperature Curie point may be identified at 28% $SrTiO_3$ and 66% $SrTiO_3$ on each curve, respectively. Between these two points (on the horizontal room temperature line), there is a region where 25° C. Curie points may be found from $Ba_{(1-x-y)}Pb_ySr_xTiO_3$ and where various values of x and y exist. This region also limits the $SrTiO_3$ concentration, i.e., limits the values of x to an allowable range of 28% to 66%.

By selecting a particular molar concentration of $SrTiO_3$ (i.e., selecting the value of "x"), the concentrations of $PbTiO_3$ ("y") and $BaTiO_3$ ("1−x−y") can be determined. To do this, a vertical line is drawn from 120° C. (point D) to 490° C. (point E) on the temperature axis. This vertical line, DE, is subdivided into 10 (or alternatively, 100) equal units which forms a scale and designates the decimal mole fraction of $PbTiO_3$ that is allowed based upon the assigned $SrTiO_3$ concentration. This is indicated in FIG. 1-B.

To determine a value of y, the first step is to assign a known value of x, the $SrTiO_3$ concentration. Then, a first point is located on a first graphical representation comprising a temperature axis representing Curie points in °C. and a concentration axis representing mole percentage of $SrTiO_3$, in the $BaTiO_3/SrTiO_3$ system, the first point corresponding to the intersection of an abscissa representing x expressed as a mole percentage with an ordinate representing a temperature of 25° C.

Next, a second point is located on the first graphical representation corresponding to the intersection of an abscissa representing 100% $SrTiO_3$ with an ordinate representing a temperature of −220° C.

A straight line is then drawn from the second point through the first point, and the line is extended to intercept the temperature axis and line DE at a third point. Line DE is subdivided into 10 equal parts and represents the decimal mole fraction of $PbTiO_3$ in the $BaTiO_3/PbTiO_3$ system.

By multiplying the decimal mole fraction of $PbTiO_3$ identified by the third point by a value equal to 1−x, the value of y is determined.

Obviously, use of the present graphical method is not necessarily restricted to room temperature applications. Thus, in other embodiments, the method of estimating a multi-component composition of the ferroelectric material of the present invention is based upon temperatures other than room temperature Curie points. By re-drawing horizontal lines on FIGS. 1A and 1B, the estimation of compositions having Curie point temperatures other than room temperature can be made. For practical purposes, the range of temperatures which could be selected as Curie points for the material are from −40° C. to 60° C. Thus, the broadest limits for x can be identified as from about 0.20 to 0.75, and for y from about zero to 0.40.

While the present graphical estimation method has been disclosed for the $BaPbSrTiO_3$ material a similar set of graphical representations can also be drawn, for example, for the $BaPbCdTiO_3$ material. This assumes $BaTiO_3/CdTiO_3$ and $PbTiO_3/CdTiO_3$ are both reasonably linear systems with respect to Curie point vs. composition.

The preparation of the $Ba_{(1-x-y)}Pb_yM_xTiO_3$ materials can be accomplished in bulk form through standard methods well known to those of ordinary skill in the art, typically involving the mixing of powders, for example $BaTiO_3$, $SrTiO_3$, and $PbTiO_3$, in the desired molar or weight percentages, and then sintering the mixture to produce the desired sample. The material can be mixed by physically mixing the finely ground powders, or by sol-gel techniques well known to those of ordinary skill in the art. In addition, thin-films of the material can be produced through other methods such as vacuum sputtering techniques.

EXAMPLES

In each of Examples 1–3, the character "M" in the general formula (I) represents Sr, and the Curie point temperature is 25° C.

Example 1

A value of x, the $SrTiO_3$ concentration, was selected as 60%, which allows 40% of the material to comprise $BaTiO_3$ and $PbTiO_3$. A point was marked on the room temperature line corresponding to 60% $SrTiO_3$ (identified on FIG. 1-B as point 1). A diagonal line was drawn from the 100% $SrTiO_3$ point at −220° C., through the 60% $SrTiO_3$ point at 25° C., and extended further to the vertical line on the temperature axis. The intercept of this line on the vertical scale designates the decimal fraction of $PbTiO_3$ allowed. In this case, the intercept was at 0.75, as depicted in FIG. 1-B. Since the assigned concentration of $SrTiO_3$ was 60%, leaving 40% to be the combined $BaTiO_3$ and $PbTiO_3$, then the intercept value of 0.75 multiplied by the concentration of 40% equals 30% as the concentration of $PbTiO_3$. Therefore, y=30%, or a mole fraction of 0.30. The entire composition is therefore designated as: $Ba_{(1-x-y)}Pb_ySr_xTiO_3=Ba_{0.10}Pb_{0.30}Sr_{0.60}TiO_3$.

Example 2

A value of x, the $SrTiO_3$ concentration, was selected as 50%, which allows the remaining 50% of the material to comprise $BaTiO_3$ and $PbTiO_3$. A point was marked on the room temperature line corresponding to 50% $SrTiO_3$ (identified on FIG. 1-B as point 2). A diagonal line was drawn from the 100% $SrTiO_3$ point at −220° C., through the 50% $SrTiO_3$ point at 25° C., and extended further to the vertical line on the temperature axis. In this case, the intercept was at 0.40. Since the assigned concentration of $SrTiO_3$ was 50%, leaving 50% to be the combined $BaTiO_3$ and $PbTiO_3$, then the intercept value of 0.40 multiplied by the concentration of 50% equals 20% as the concentration of $PbTiO_3$. Therefore, y=20%, or a mole fraction of 0.20. The composition is designated as: $Ba_{0.30}Pb_{0.20}Sr_{0.50}TiO_3$.

Example 3

A value of x for $SrTiO_3$ concentration was selected as 40%, which allows the remaining 60% of the material to comprise $BaTiO_3$ and $PbTiO_3$. A point was marked on the room temperature line corresponding to 40% $SrTiO_3$ (identified on FIG. 1-B as point 3). A diagonal line was drawn from the 100% $SrTiO_3$ point at −220° C., through the 40% $SrTiO_3$ point at 25° C., and extended further to the vertical line on the temperature axis. In this case, the intercept was at 0.18. Since the assigned concentration of $SrTiO_3$ was 40%, leaving 60% to be the combined $BaTiO_3$ and $PbTiO_3$, then the intercept value of 0.18 multiplied by the concentration of 60% equals 11% as the concentration of $PbTiO_3$. Therefore, y=11%, or a mole fraction of 0.11. The composition is designated as: $Ba_{0.49}Pb_{0.11}Sr_{0.40}TiO_3$.

Figure 2:
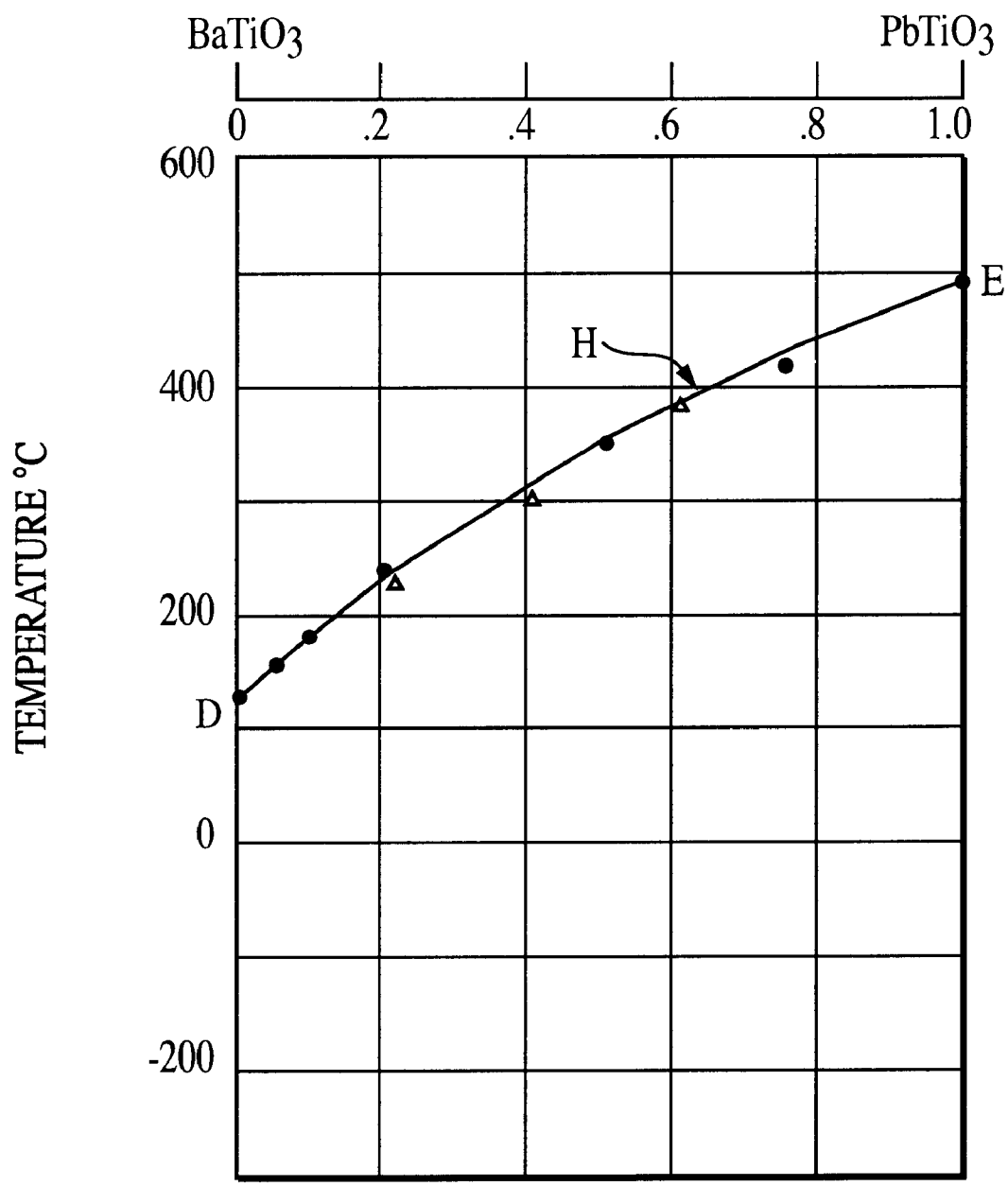
FIG. 2 shows Curie point vs. composition for the $BaTiO_3/PbTiO_3$ system as curve H.
Figure 3:
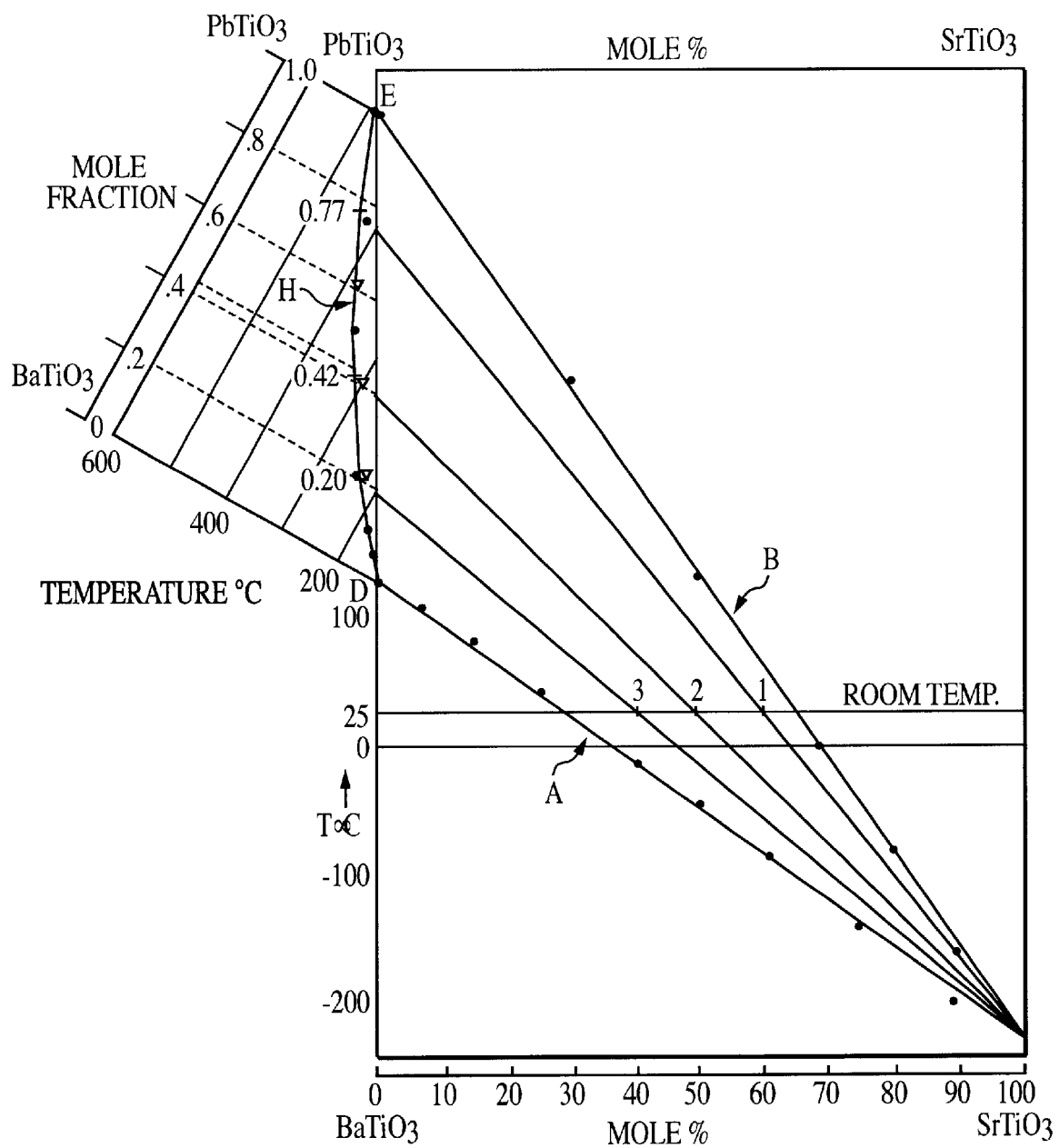
FIG. 3 combines curves A, B and H.

In view of the graphical nature of the method, the values for the compositions determined in this manner must be considered as estimates, at best. These estimates can be improved somewhat by recognizing that the compositional diagram of the $BaTiO_3/PbTiO_3$ system (FIG. 2) is not perfectly linear, as is inferred by the vertical scale used in Examples 1–3. The actual compositional diagram of this system is seen in FIG. 2 indicating this non-linearity. By replacing the linear vertical line, DE, with the nonlinear curve H from FIG. 2, a slightly more accurate value can be obtained for the decimal fraction of $PbTiO_3$ allowed. The extended diagonal lines yield a slightly higher fraction at the curve's intercept, as depicted in FIG. 3. In each of Examples 1–3, the small improvement is approximately 1%, as illustrated in Table 1.

TABLE 1

| x ($SrTiO_3$) | y ($PbTiO_3$) | Improved Value y ($PbTiO_3$) |
| --- | --- | --- |
| 0.60 | 0.30 | 0.31 |
| 0.50 | 0.20 | 0.21 |
| 0.40 | 0.11 | 0.12 |

It should be emphasized that exact compositions for room temperature Curie points of 25° C. may only be determined by actual fabrication and electronic evaluation of the material. The graphical method of the present invention facilitates the preparation of a simple first order estimate.

In addition to the fact that the composition $Ba_{(1−x−y)}Pb_ySr_xTiO_3$ represents an alternative to the use of either $BaSrTiO_3$ or $PbSrTiO_3$, it may have other potential advantages. First, as a 3-component titanate, it offers an extra degree of freedom in the fabrication of material having a specific Curie temperature, i.e., 25° C. for room temperature use. This extra degree of freedom is evident in the broad composition range as designated between 28% $SrTiO_3$ and 66% $SrTiO_3$ on the room temperature line of FIG. 1.

Second, this material may be easier to fabricate via co-sputtering in a Magnetron Sputter system. Thus, there may be a very practical reason for considering the material with respect to the degree of ease by which one of the three titanates may co-deposit in the presence of other titanates.

Third, the material has a potentially high efficiency as a ferroelectric.

Fourth, depending on the composition of the material, it may have extremely small grain size, and thus find utility as a polycrystalline material.

The present invention, therefore, provides a simple graphical means by which to provide a first order estimate of the desired compositions of a multi-component material.

While only certain preferred embodiments of this invention have been shown and described by way of illustration, many modifications will occur to those skilled in the art. Thus, while the present graphical estimation method has been disclosed for the $BaPbSrTiO_3$ system, a similar set of graphical representations can also be drawn, for example, for the $BaPbCdTiO_3$ system. It is therefore desired that it be understood that it is intended herein to cover all such modifications that fall within the true spirit and scope of this invention.

What is claimed is:

1. A method of preparing a multi-component material having a specific desired Curie point represented by the general formula (I):

$$Ba_{(1−x−y)}Pb_yM_xTiO_3 \qquad (I)$$

in which:

M is selected from the group consisting of Sr or Cd;

x is the decimal fraction molar concentration of $MTiO_3$, where x has a value equal to or greater than 0.20 and less than or equal to 0.75;

y is the decimal fraction molar concentration of $PbTiO_3$, where y has a value greater than zero and less than or equal to 0.40, and x+y is less than 1.0;

comprising the steps of:

selecting a value of said x;

locating a first point on a first graphical representation comprising a temperature axis representing Curie points in °C. and a concentration axis representing mole percentage of $BaTiO_3$ and $MTiO_3$, said first point corresponding to the intersection of an abscissa representing said x expressed as a percentage with an ordinate representing a specific desired Curie point temperature T between about −40° C. to 60° C.;

locating a second point on said first graphical representation corresponding to the intersection of an abscissa representing 100% $MTiO_3$ with an ordinate representing a temperature of −220° C.;

drawing a straight line from said second point through said first point, and extending said line to intercept said temperature axis and a scale representing the decimal mole fraction of $PbTiO_3$ in the $BaTiO_3/PbTiO_3$ system at a third point;

multiplying said decimal mole fraction of $PbTiO_3$ identified by said third point by a value equal to 1−x to determine a value of said y;

mixing powders of $BaTiO_3$, $PbTiO_3$ and $MTiO_3$ in the calculated fractional molar concentrations; and sintering the mixture to produce the desired multi-component material.

2. The method according to claim 1 wherein said x has a value equal to or greater than 0.28 and less than or equal to 0.66, and said y has a value greater than zero and less than or equal to 0.34.

3. The method according to claim 1, wherein said temperature T is 25° C.

4. A method of preparing a multi-component material having a specific desired Curie point represented by the general formula (I):

$$Ba_{(1−x−y)}Pb_yM_xTiO_3 \qquad (I)$$

in which:

M is selected from the group consisting of Sr or Cd;

x is the decimal fraction molar concentration of $MTiO_3$, where x has a value equal to or greater than 0.20 and less than or equal to 0.75;

y is the decimal fraction molar concentration of $PbTiO_3$, where y has a value greater than zero and less than or equal to 0.40, and x+y is less than 1.0;

comprising the steps of:

selecting a value of said x;

locating a first point on a first graphical representation comprising a temperature axis representing Curie points in °C. and a concentration axis representing mole percentage of $BaTiO_3$ and $MTiO_3$, said first point corresponding to the intersection of an abscissa representing said x expressed as a percentage with an ordinate representing a specific desired Curie point temperature T between about −40° C. to 60° C.;

locating a second point on said first graphical representation corresponding to the intersection of an abscissa representing 100% $MTiO_3$ with an ordinate representing a temperature of −220° C.;

drawing a straight line from said second point through said first point, and extending said line to intercept said temperature axis and a scale representing the decimal mole fraction of $PbTiO_3$ in the $BaTiO_3/PbTiO_3$ system at a third point;

multiplying said decimal mole fraction of $PbTiO_3$ identified by said third point by a value equal to 1−x to determine a value of said y; and sequentially co-sputtering $BaTiO_3$, $PbTiO_3$ and $MTiO_3$ in a Magnetron Sputter system to deposit a thin film of the desired fractional molar composition of the multi-component material on a substrate.

5. The method according to claim 4, wherein said x has a value equal to or greater than 0.28 and less than or equal to 0.66, and said y has a value greater than zero and less than or equal to 0.34.

6. The method according to claim 4, wherein said temperature T is 25° C.

* * * * *